US007826228B2

(12) United States Patent
Audet et al.

(10) Patent No.: US 7,826,228 B2
(45) Date of Patent: **\*Nov. 2, 2010**

(54) PISTON RESET APPARATUS FOR A MULTICHIP MODULE AND METHOD FOR RESETTING PISTONS IN THE SAME

(75) Inventors: Gerald P. Audet, Granby (CA); Sylvain Dussault, Saint Hubert (CA); Pierre LaCasse, Granby (CA); Jean-Luc Landreville, Granby (CA)

(73) Assignee: International Business Machines Corporation, Armonk, NY (US)

( * ) Notice: Subject to any disclaimer, the term of this patent is extended or adjusted under 35 U.S.C. 154(b) by 309 days.

This patent is subject to a terminal disclaimer.

(21) Appl. No.: 12/143,940

(22) Filed: Jun. 23, 2008

(65) Prior Publication Data

US 2008/0264606 A1    Oct. 30, 2008

Related U.S. Application Data

(63) Continuation of application No. 11/739,773, filed on Apr. 25, 2007, now Pat. No. 7,405,940.

(51) Int. Cl.
    *H05K 7/20* (2006.01)

(52) U.S. Cl. .................. 361/704; 361/715; 361/719; 439/66; 439/71; 439/73; 257/719; 257/723

(58) Field of Classification Search ................. 361/702, 361/704, 710, 715, 719, 729, 736, 737
See application file for complete search history.

(56) References Cited

U.S. PATENT DOCUMENTS

| 4,748,495 A | * | 5/1988 | Kucharek | 257/713 |
| 4,765,397 A | | 8/1988 | Chrysler et al. | |
| 4,830,623 A | * | 5/1989 | Owens et al. | 439/71 |
| 5,014,117 A | | 5/1991 | Horvath et al. | |
| 5,052,481 A | | 10/1991 | Horvath et al. | |
| 5,388,635 A | | 2/1995 | Gruber et al. | |
| 5,558,563 A | | 9/1996 | Cote et al. | |
| 5,919,050 A | * | 7/1999 | Kehley et al. | 439/71 |
| 6,049,456 A | * | 4/2000 | Messina et al. | 361/704 |
| 6,133,547 A | | 10/2000 | Maynard | |
| 6,162,066 A | * | 12/2000 | Glick et al. | 439/73 |
| 6,278,084 B1 | | 8/2001 | Maynard | |
| 6,354,844 B1 | * | 3/2002 | Coico et al. | 439/66 |

(Continued)

*Primary Examiner*—Jayprakash N Gandhi
*Assistant Examiner*—Courtney Smith
(74) *Attorney, Agent, or Firm*—Cantor Colburn LLP; Ian MacKinnon

(57) ABSTRACT

Disclosed is a piston reset apparatus for a multichip module that includes a base with multiple projections and two unit associating pegs extending from opposite ends of the base, a hat disposed upwardly of the base and including multiple adjustable pistons vertically adjustable within the hat, each of the plurality of adjustable pistons being disposed in alignment with one of the multiple projections, a mass equivalent plate disposed upwardly of the hat and being configured to hold a spring loaded sleeve, the spring loaded sleeve including a plurality of springs, each of the springs being aligned with and configured to apply pressure upon one of the multiple pistons, a spring loaded clamp disposed upwardly of the plate and including a spring loaded portion and a retaining portion, the retaining portion defining two cavities configured to fixedly associate with an associating groove defined by each of the unit associating pegs.

4 Claims, 3 Drawing Sheets

U.S. PATENT DOCUMENTS

| | | | |
|---|---|---|---|
| 6,404,638 B1 * | 6/2002 | Messina | 361/715 |
| 7,400,504 B2 * | 7/2008 | Campbell et al. | 361/699 |
| 2002/0050398 A1 | 5/2002 | Coico et al. | |
| 2005/0037640 A1 * | 2/2005 | Messina et al. | 439/71 |
| 2005/0231918 A1 * | 10/2005 | Goldmann | 361/704 |

* cited by examiner

PISTON RESET APPARATUS FOR A MULTICHIP MODULE AND METHOD FOR RESETTING PISTONS IN THE SAME

CROSS REFERENCE TO RELATED APPLICATION

This application is a Continuation application of U.S. Ser. No. 11/739,773, filed Apr. 25, 2007, the contents of which are incorporated by reference herein in their entirety.

BACKGROUND OF THE INVENTION

1. Field of the Invention

The disclosure relates generally to a piston reset apparatus, and more particularly to a piston reset apparatus for a multichip module 2. Description of the Background All semiconductor chips do not necessarily generate the same level of heat or function satisfactorily at the same temperature. Thus, in MCM (multichip module) products, it is critical to position heat dissipating slugs properly with respect each chip. By properly positioning these slugs, heat may be appropriately dissipated, and chips may be maintained at proper functioning temperatures. A factor affecting the rate and amount of heat dissipated from a chip is the spacing between the chip and the heat slug.

A typical assembled MCM product consists of a hat that includes an array of pistons. Each of these pistons acts as a heat slug for a respective chip.

The height of some of the pistons is fixed in the hat, while others of the pistons are moveable and their heights may be adjusted to provide appropriate spacing for each respective chip. Sometimes there is a need to readjust the height of pistons. In order to allow the hat to be re-used, pistons must be first reset or repositioned near their initial positions prior to a being subjected to height adjustment.

The piston reset apparatus and operation presently used makes use of a plate that pushes equally on all movable pistons until the plate contacts the fixed pistons. For a variety of reasons, this apparatus and operation does not always provide proper positioning of the pistons for the MCM product subsequently assembled. As such, a more effective manner of resetting moveable pistons in an MCM would be desirable.

SUMMARY OF THE INVENTION

Disclosed is a piston reset apparatus for a multichip module, the apparatus including a base that includes a stand off area, the stand off area including a plurality of projections, the base also including two unit associating pegs extending from a relative top surface of the base, the two unit associating pegs being disposed on opposite ends of the base, a hat disposed upwardly of the base, the hat including a plurality of pistons that are positionally fixed in the hat and a plurality of adjustable pistons that are vertically adjustable within the hat in a direction towards the base, wherein each of the plurality of adjustable pistons is disposed within the hat to be in alignment with one of the plurality of projections.

The apparatus also includes a mass equivalent plate disposed upwardly of the hat, the mass equivalent plate being configured to hold a spring loaded sleeve at a surface of the mass equivalent plate that is in closest proximity to the hat, the spring loaded sleeve including a plurality of springs, wherein each of the plurality of springs is aligned with and configured to apply pressure upon one of the plurality of pistons.

The apparatus additionally includes a spring loaded clamp disposed upwardly of the mass equivalent plate, the spring loaded clamp including a spring loaded portion and a retaining portion, the spring loaded portion being disposed adjacently to a relative top surface of the mass equivalent plate, and the retaining portion defining two cavities, each of the two cavities being configured to fixedly associate with an associating groove defined by each of the two unit associating pegs.

Further disclosed is a method for resetting pistons in a multichip module, the method including providing a base including a plurality of projections, disposing a hat upwardly of the base, the hat including a plurality of pistons that are positionally fixed in the hat and a plurality of adjustable pistons that are vertically adjustable within the hat in a direction towards the base, aligning each of the plurality of adjustable pistons with one of the plurality of projections, holding a spring loaded sleeve having a plurality of springs with a mass equivalent plate and disposing the spring loaded sleeve and the mass equivalent plate upwardly adjacent of the hat, aligning each spring of the spring loaded sleeve with one of the plurality of adjustable pistons, clamping the base, the hat, the spring loaded sleeve, and the mass equivalent plate together via a spring loaded clamp, subjecting a temporary assembly of the hat, the mass equivalent plate, the base, the spring loaded sleeve, and the clamp to a furnace reflow operation, causing the springs of the spring loaded sleeve to apply a pressure to each of the adjustable pistons via the subjecting, and resetting the adjustable pistons to their original positions via the pressure.

BRIEF DESCRIPTION OF THE DRAWINGS

The following descriptions should not be considered limiting in any way. With reference to the accompanying drawings, like elements are numbered alike.

DETAILED DESCRIPTION OF THE INVENTION

Figure 1:
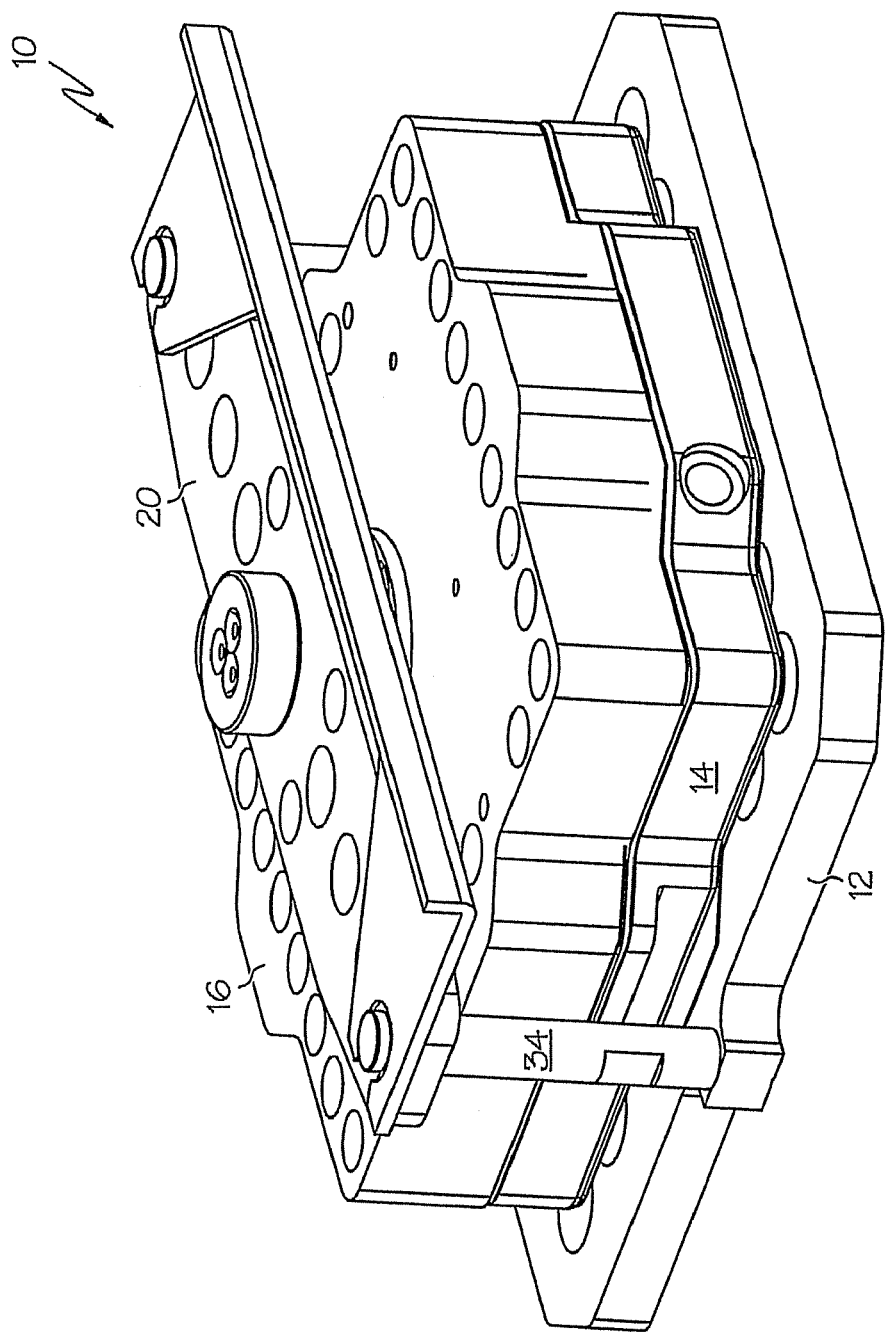
FIG. 1 is a perspective view of a piston reset apparatus for a multichip module
Figure 2:
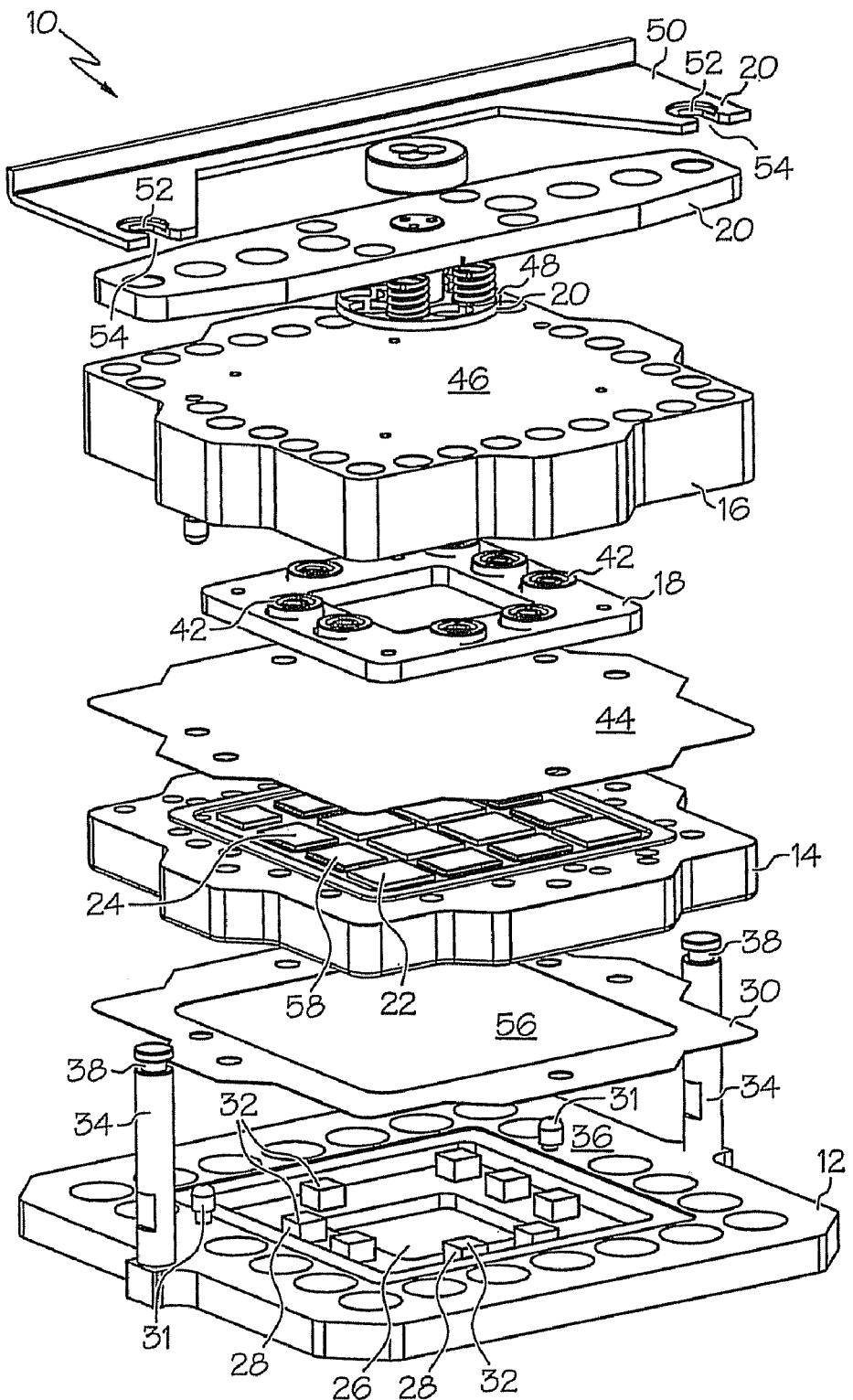
FIG. 2 is an exploded perspective view of the piston reset apparatus for a multichip module.
Figure 3:
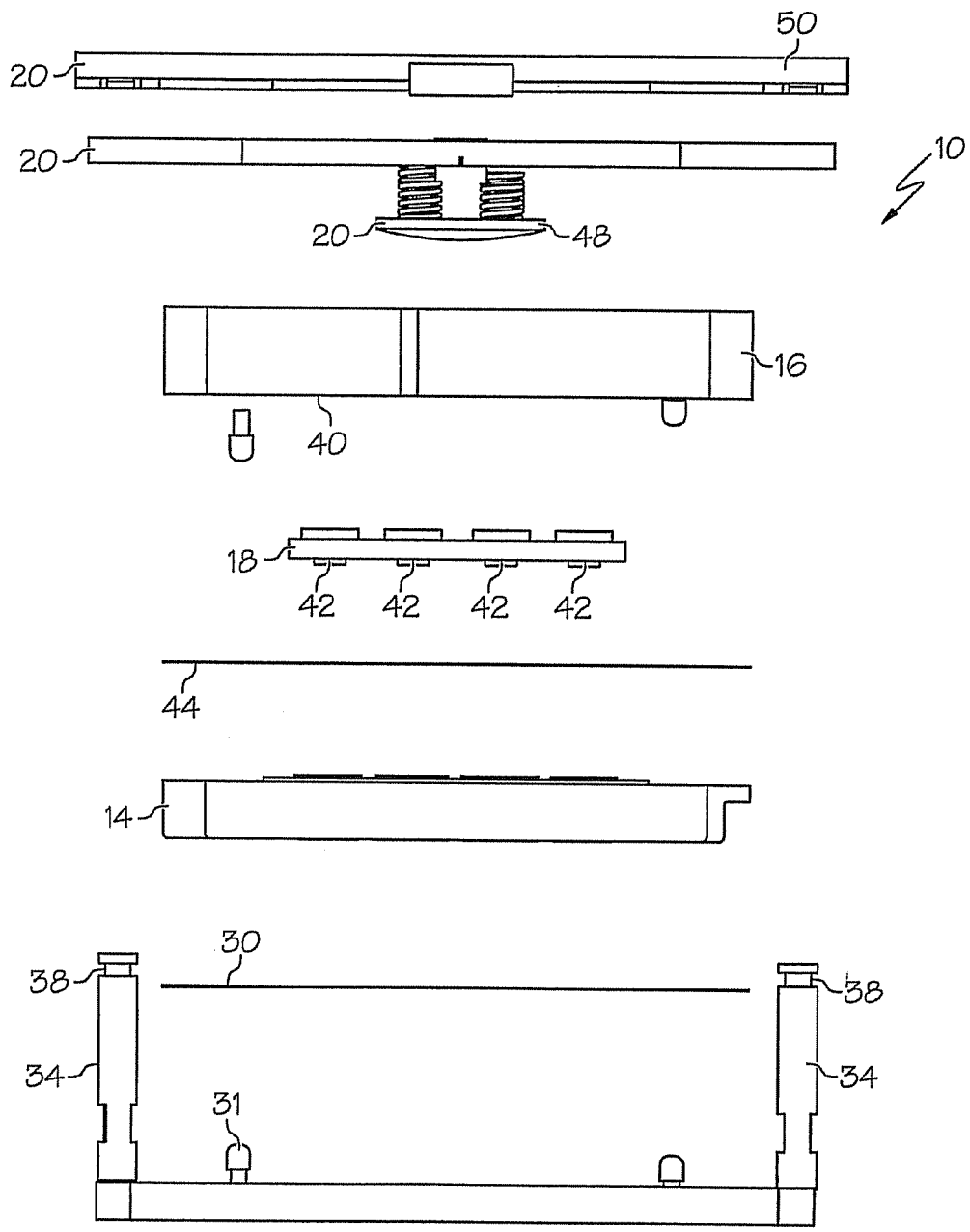
FIG. 3 is an exploded elevated view of the piston reset apparatus for a multichip module.

Referring to FIGS. 1-3, there is illustrated an exemplary embodiment of piston reset apparatus 10 for a multichip module (MCM) hat. The Apparatus includes a base 12, a hat 14, a mass equivalent plate 16, a spring loaded sleeve 18, and a spring loaded clamp 20, which are all configured to be temporarily assembled to form the apparatus 10. These components of the apparatus 10 will be discussed herein, beginning with the hat 14.

The hat 14 includes a plurality of pistons that act as heat slugs for a respective chip in the MCM in which they reside. Some of these pistons are fixed pistons 22, which are positionally fixed in the hat 14, while the other pistons are adjustable pistons 24, which are vertically adjustable within the hat 14. These adjustable pistons 24 are vertically adjustable so as to allow appropriate spacing from each respective chip within an MCM module. Resetting of these adjustable pistons 24 entails a relative downward movement of the pistons 24.

That hat 14 is disposed upwardly of the base 12. The base 12 defines a stand off area 26, which includes a plurality of projections 28. Each of these projections 28 is aligned with one of the adjustable pistons 24 (with each piston 24 being aligned with a one of the projections 28). Though FIGS. 2 and 3 show a shim structure 30 (which will be discussed in greater detail later in the description) disposed between the hat 14 and base 12, it should be appreciated that the shim structure 30 is optional, and that the hat 14 may be disposed so as to be in direct contact with the base 12, wherein the hat 14 and base 12 are aligned via at least two pegs 31 (preferably two to four pegs 31). If the shim 30 is not present, the downward resetting movement (as discussed above) of the adjustable pistons 24 is mechanically limited by the presence of the projection 28 aligned with the particular piston 24. In other words, a top surface 32 of each of the projections 28 delimits an extent to which the adjustable pistons 24 may be vertically adjusted in the downward resetting direction towards the base 12. It should be appreciated that the top surfaces 32 of the projections 28 in the base 12 include smaller surface areas than a relative bottom surface of the adjustable pistons 24.

The base 12 also includes two unit associating pegs 34 extending from a relative top surface 36 of the base 12. These pegs 34 are disposed at opposite ends of the base 12, and the pegs 34 each define an associating groove 38 at a relative upper region of the pegs 34 of the hat 12. As will be discussed later in the description, the associating grooves 38 act to hold the components of the apparatus 10 together during a resetting furnace reflow operation.

Disposed upwardly of the hat 14 and base 12 is the mass equivalent plate 16. The mass equivalent plate 16 is configured to hold the spring loaded sleeve 18 at a surface 40 of the mass equivalent plate 16 that is in closest proximity to the hat 14 (i.e. the relative bottom surface 40 of the mass equivalent plate 16). The spring loaded sleeve 18 includes a plurality of springs 42 that are each aligned with one of the adjustable pistons 24 (with each piston 24 being aligned with one of the springs 42). Each spring 42 is configured to apply pressure to the adjustable piston 24 with which it is aligned. Though a flexible protector 44 (which will be discussed in greater detail later in the description) is illustrated between the sleeve 18 and hat 14 in the FIGS. 2 and 3, it should be appreciated that the springs 42 of the sleeve 18 may be in direct contact with the pistons 24, and as such, the springs 42 may apply direct pressure to the adjustable pistons 24. This pressure from the springs 18 moves the adjustable pistons 24 downward for resetting when the apparatus is assembled and subjected to the furnace reflow operation.

Disposed upwardly of the mass equivalent plate 16 and adjacent to a relative top surface 46 of the mass equivalent plate 16 is the spring loaded clamp 20. The spring loaded clamp 20 includes a spring loaded portion 48 and a retaining portion 50. The spring loaded portion 48 is disposed adjacently to the relative top surface 46 of the mass equivalent plate 16, while the retaining portion 50 is disposed upwardly of the spring loaded portion 48. The retaining portion 50 defined two cavities 52 disposed at opposite ends of the retaining portion 50. These cavities 52 are configured to fixedly associate (temporarily) with the associating grooves 38 of the associating pegs 34 via openings 54 in each cavity 52. When associated with pegs 34, the clamp 20 positions the spring loaded portion 48 to apply pressure to the mass equivalent plate 16, thereby pressing the springs 42 of the sleeve 18 into a position to apply pressure to (and reset) the adjustable pistons 24 of the hat 14. In addition, association of the cavities 52 with the pegs 34 allows for a temporary association of all of the components of the apparatus 10, thereby preparing the apparatus 10 for the reflow operation and piston resetting.

As was mentioned above and is shown in FIGS. 2 and 3, the shim structure 30 may be disposed between the hat 14 and the base 12. If this shim structure 30 is present, the downward resetting movement (as discussed above) of the adjustable pistons 24 is mechanically defined by the presence of the shim structure 30. In other words, a thickness of the shim structure 56 proportionally defines the extent to which the adjustable pistons 24 may be vertically adjusted in the downward resetting direction towards the base 12.

As was also mentioned above and is shown in FIGS. 2 and 3, the flexible protector 44 may be disposed between the hat 14 and the sleeve 18. If present, the protector 44 would act to protect delicate top surfaces 58 of the adjustable pistons 24 from any possibly damaging contact with the springs 42.

While the invention has been described with reference to an exemplary embodiment, it should be understood by those skilled in the art that various changes may be made and equivalents may be substituted for elements thereof without departing from the scope of the invention. In addition, many modifications may be made to adapt a particular situation or substance to the teachings of the invention without departing from the scope thereof. Therefore, it is important that the invention not be limited to the particular embodiment disclosed as the best mode contemplated for carrying out this invention, but that the invention will include all embodiments falling within the scope of the apportioned claims. Moreover, unless specifically stated any use of the terms first, second, etc. do not denote any order or importance, but rather the terms first, second, etc. are used to distinguish one element from another.

What is claimed is:

1. A piston reset apparatus for a multichip module, the apparatus comprising:
    a base that includes a stand off area, said stand off area including a plurality of projections, said base also including two unit associating pegs extending from a relative top surface of said base, said two unit associating pegs being disposed on opposite ends of said base;
    a hat disposed upwardly of said base, said hat including a plurality of pistons that are positionally fixed in said hat and a plurality of adjustable pistons that are vertically adjustable within said hat in a direction towards said base, wherein each of said plurality of adjustable pistons is disposed within said hat to be in alignment with one of said plurality of projections;
    a mass equivalent plate disposed upwardly of said hat, said mass equivalent plate being configured to hold a spring loaded sleeve at a surface of said mass equivalent plate that is in closest proximity to said hat, said spring loaded sleeve including a plurality of springs, wherein each of said plurality of springs is aligned with and configured to apply pressure upon one of said plurality of pistons; and
    a spring loaded clamp disposed upwardly of said mass equivalent plate, said spring loaded clamp including a spring loaded portion and a retaining portion, said spring loaded portion being disposed adjacently to a relative top surface of said mass equivalent plate, and said retaining portion defining two cavities, each of said two cavities being configured to fixedly associate with an associating groove defined by each of said two unit associating pegs.

2. The apparatus of claim 1, wherein said projections each include a relative top surface configured delimit an extent to which said adjustable pistons can be vertically adjusted in said direction towards said base, said top surfaces including a smaller surface area than a relative bottom surface of said adjustable pistons.

3. The apparatus of claim 1, further including a shim structure disposed between said base and said hat, wherein said shim structure is configured to define an extent to which said adjustable pistons can be vertically adjusted in said direction towards said base.

4. The apparatus of claim 1, further including a flexible protector disposed between said spring loaded sleeve and said pistons.

* * * * *